United States Patent
Yi et al.

(10) Patent No.: US 12,089,504 B2
(45) Date of Patent: Sep. 10, 2024

(54) MAGNETIC RANDOM ACCESS MEMORY DEVICE AND METHOD FOR FABRICATING THE SAME

(71) Applicant: UNITED MICROELECTRONICS CORP., Hsin-Chu (TW)

(72) Inventors: Yen-Tsai Yi, Tainan (TW); Wei-Chuan Tsai, Changhua County (TW); Jin-Yan Chiou, Tainan (TW); Hsiang-Wen Ke, Kaohsiung (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 406 days.

(21) Appl. No.: 17/361,331

(22) Filed: Jun. 29, 2021

(65) Prior Publication Data
US 2022/0384710 A1   Dec. 1, 2022

(30) Foreign Application Priority Data
May 31, 2021   (CN) .......................... 202110599237.6

(51) Int. Cl.
*H10N 50/80* (2023.01)
*H10B 61/00* (2023.01)
*H10N 50/01* (2023.01)

(52) U.S. Cl.
CPC .............. *H10N 50/80* (2023.02); *H10B 61/00* (2023.02); *H10N 50/01* (2023.02)

(58) Field of Classification Search
CPC ......... H10N 50/80; H10N 50/01; H10B 61/00
See application file for complete search history.

(56) References Cited

U.S. PATENT DOCUMENTS

2021/0020828 A1 * 1/2021 Wang ..................... H10N 50/10

* cited by examiner

*Primary Examiner* — Jami Valentine Miller
(74) *Attorney, Agent, or Firm* — Winston Hsu

(57) ABSTRACT

A method for fabricating a magnetic random access memory (MRAM) device includes the steps of first forming a magnetic tunneling junction (MTJ) stack on a substrate, forming a first top electrode on the MTJ stack, and then forming a second top electrode on the first top electrode. Preferably, the first top electrode includes a gradient concentration while the second top electrode includes a non-gradient concentration.

10 Claims, 6 Drawing Sheets

MAGNETIC RANDOM ACCESS MEMORY DEVICE AND METHOD FOR FABRICATING THE SAME

BACKGROUND OF THE INVENTION

1. Field of the Invention

The invention relates to a method for fabricating semiconductor device, and more particularly to a method for fabricating magnetoresistive random access memory (MRAM).

2. Description of the Prior Art

Magnetoresistance (MR) effect has been known as a kind of effect caused by altering the resistance of a material through variation of outside magnetic field. The physical definition of such effect is defined as a variation in resistance obtained by dividing a difference in resistance under no magnetic interference by the original resistance. Currently, MR effect has been successfully utilized in production of hard disks thereby having important commercial values. Moreover, the characterization of utilizing GMR materials to generate different resistance under different magnetized states could also be used to fabricate MRAM devices, which typically has the advantage of keeping stored data even when the device is not connected to an electrical source.

The aforementioned MR effect has also been used in magnetic field sensor areas including but not limited to for example electronic compass components used in global positioning system (GPS) of cellular phones for providing information regarding moving location to users. Currently, various magnetic field sensor technologies such as anisotropic magnetoresistance (AMR) sensors, GMR sensors, magnetic tunneling junction (MTJ) sensors have been widely developed in the market. Nevertheless, most of these products still pose numerous shortcomings such as high chip area, high cost, high power consumption, limited sensibility, and easily affected by temperature variation and how to come up with an improved device to resolve these issues has become an important task in this field.

SUMMARY OF THE INVENTION

According to an embodiment of the present invention, a method for fabricating a magnetic random access memory (MRAM) device includes the steps of first forming a magnetic tunneling junction (MTJ) stack on a substrate, forming a first top electrode on the MTJ stack, and then forming a second top electrode on the first top electrode. Preferably, the first top electrode includes a gradient concentration while the second top electrode includes a non-gradient concentration.

According to another aspect of the present invention, a magnetic random access memory (MRAM) device includes a magnetic tunneling junction (MTJ) on a substrate, a first top electrode on the MTJ, and a second top electrode on the first top electrode. Preferably, the first top electrode includes a gradient concentration while the second top electrode includes a non-gradient concentration.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
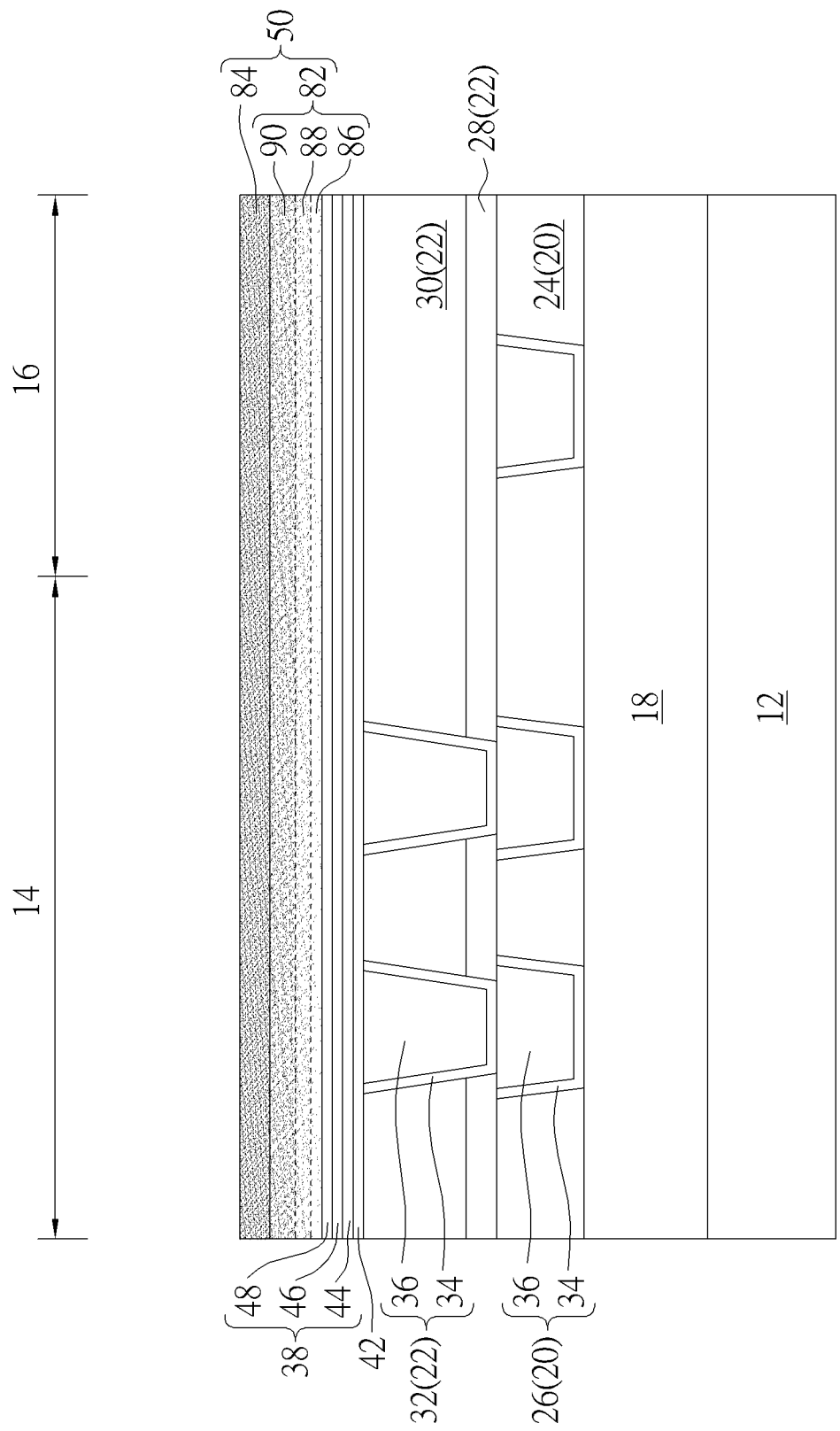
FIGS. 1-6 illustrate a method for fabricating a MRAM device according to an embodiment of the present invention.

Referring to FIGS. 1-6, FIGS. 1-6 illustrate a method for fabricating a MRAM device according to an embodiment of the present invention. As shown in FIG. 1, a substrate 12 made of semiconductor material is first provided, in which the semiconductor material could be selected from the group consisting of silicon (Si), germanium (Ge), Si—Ge compounds, silicon carbide (SiC), and gallium arsenide (GaAs), and a MRAM region 14 and a logic region 16 are defined on the substrate 12.

Active devices such as metal-oxide semiconductor (MOS) transistors, passive devices, conductive layers, and interlayer dielectric (ILD) layer 18 could also be formed on top of the substrate 12. More specifically, planar MOS transistors or non-planar (such as FinFETs) MOS transistors could be formed on the substrate 12, in which the MOS transistors could include transistor elements such as gate structures (for example metal gates) and source/drain region, spacer, epitaxial layer, and contact etch stop layer (CESL). The ILD layer 18 could be formed on the substrate 12 to cover the MOS transistors, and a plurality of contact plugs could be formed in the ILD layer 18 to electrically connect to the gate structure and/or source/drain region of MOS transistors. Since the fabrication of planar or non-planar transistors and ILD layer is well known to those skilled in the art, the details of which are not explained herein for the sake of brevity.

Next, metal interconnect structures 20, 22 are sequentially formed on the ILD layer 18 on the MRAM region 14 and the logic region 16 to electrically connect the aforementioned contact plugs, in which the metal interconnect structure 20 includes an inter-metal dielectric (IMD) layer 24 and metal interconnections 26 embedded in the IMD layer 24, and the metal interconnect structure 22 includes a stop layer 28, an IMD layer 30, and metal interconnections 32 embedded in the stop layer 28 and the IMD layer 30.

In this embodiment, each of the metal interconnections 26 from the metal interconnect structure 20 preferably includes a trench conductor and the metal interconnection 32 from the metal interconnect structure 22 on the MRAM region 14 includes a via conductor. Preferably, each of the metal interconnections 26, 32 from the metal interconnect structures 20, 22 could be embedded within the IMD layers 24, 30 and/or stop layer 28 according to a single damascene process or dual damascene process. For instance, each of the metal interconnections 26, 32 could further include a barrier layer 34 and a metal layer 36, in which the barrier layer 34 could be selected from the group consisting of titanium (Ti), titanium nitride (TiN), tantalum (Ta), and tantalum nitride (TaN) and the metal layer 36 could be selected from the group consisting of tungsten (W), copper (Cu), aluminum (Al), titanium aluminide (TiAl), and cobalt tungsten phosphide (CoWP). Since single damascene process and dual damascene process are well known to those skilled in the art, the details of which are not explained herein for the sake of brevity. In this embodiment, the metal layers 36 in the metal interconnections 26 are preferably made of copper, the metal layer 36 in the metal interconnections 32 are made of tungsten, the IMD layers 24, 30 are preferably made of silicon oxide such as tetraethyl orthosilicate (TEOS), and the stop layer 28 is preferably made of nitrogen doped carbide (NDC), silicon nitride, silicon carbon nitride (SiCN), or combination thereof.

Next, a bottom electrode 42, a MTJ stack 38 or stack structure, a top electrode 50, and a patterned mask (not shown) are formed on the metal interconnect structure 22. In this embodiment, the formation of the MTJ stack 38 could be accomplished by sequentially depositing a pinned layer 44, a barrier layer 46, and a free layer 48 on the bottom electrode 42. In this embodiment, the bottom electrode 42 and the top electrode 50 are preferably made of conductive material including but not limited to for example Ta, Pt, Cu, Au, Al, or combination thereof. The pinned layer 44 could be made of ferromagnetic material including but not limited to for example iron, cobalt, nickel, or alloys thereof such as cobalt-iron-boron (CoFeB) or cobalt-iron (CoFe). Alternatively, the pinned layer 44 could also be made of antiferromagnetic (AFM) material including but not limited to for example ferromanganese (FeMn), platinum manganese (PtMn), iridium manganese (IrMn), nickel oxide (NiO), or combination thereof, in which the pinned layer 44 is formed to fix or limit the direction of magnetic moment of adjacent layers. The barrier layer 46 could be made of insulating material including but not limited to for example oxides such as aluminum oxide ($AlO_x$) or magnesium oxide (MgO). The free layer 48 could be made of ferromagnetic material including but not limited to for example iron, cobalt, nickel, or alloys thereof such as cobalt-iron-boron (CoFeB), in which the magnetized direction of the free layer 48 could be altered freely depending on the influence of outside magnetic field.

It should be noted that the formation of the top electrode 50 is accomplished by first forming a first top electrode 82 on the MTJ stack 38 and then forming a second top electrode 84 on the first top electrode 82, in which the first top electrode 82 includes a gradient concentration, the second top electrode 84 includes a non-gradient concentration, both the first top electrode 82 and the second top electrode 84 include TiN, and a ratio of nitrogen to titanium (N/Ti) increases from a bottom surface of the first top electrode 82 toward a top surface of the first top electrode 82.

More specifically, the formation of the first top electrode 82 and the second top electrode 84 of the top electrode 50 is accomplished by first conducting a first plasma treatment process to inject reacting gases such as nitrogen gas and/or argon gas into a reacting chamber for creating an environment and then conducting a first tuning process to adjust proportions among nitrogen gas, argon gas, and titanium for forming a first layer 86 of the first top electrode 82 on the MTJ stack 38. Next, a second plasma treatment process is conducted to inject nitrogen gas again for forming a second layer 88 of the first top electrode 82 on the surface of the first layer 86, and then a second tuning process is conducted to adjust proportions among nitrogen gas, argon gas, and titanium once more for forming a third layer 90 of the first top electrode 82 on the surface of the second layer 88. Next, a third plasma treatment process could be conducted to inject nitrogen gas for forming the second top electrode 84 on the third layer 90 of the first top electrode 82.

It should be noted that since the formation of the first top electrode 82 is accomplished by carrying out a combination of multiple plasma treatment processes and turning processes to sequentially form a plurality of material layers made of TiN with different gas concentrations or ratios on the MTJ stack 38, the first top electrode 82 or more specifically the interface between the bottom surface of the first top electrode 82 to the top surface of the first top electrode 82 preferably includes a gradient concentration and the ratio of nitrogen to titanium preferably increases from the bottom surface of the first top electrode 82 to the top surface of the first top electrode 82. It should be further noted that since the nitrogen to titanium ratio would reach a saturation or critical value at the top surface of the first top electrode 82, the nitrogen to titanium ratio of the entire second top electrode 84 starting from the bottom surface of the second top electrode 84 would not increase nor decrease once passing the boundary between the first top electrode 82 and the second top electrode 84 and thereby reaching a balanced state. In other words, the distribution of nitrogen and titanium in the entire second top electrode 84 or more specifically from the bottom surface of the second top electrode 84 to the top surface of the second top electrode 84 is at a uniform state or non-gradient concentration state.

In this embodiment, the nitrogen to titanium ratio of the second layer 88 is greater than the nitrogen to titanium ratio of the first layer 86, the nitrogen to titanium ratio of the third layer 90 is greater than the nitrogen to titanium ratio of the second layer 88, and the nitrogen to titanium ratio of the second top electrode 84 is greater than the nitrogen to titanium ratio of any layer in the first top electrode 82 such as the nitrogen to titanium ratio of the second top electrode 84 is greater than the nitrogen to titanium ratio of the third layer 90, the nitrogen to titanium ratio of the second top electrode 84 is greater than the nitrogen to titanium ratio of the second layer 88, and the nitrogen to titanium ratio of the second top electrode 84 is greater than the nitrogen to titanium ratio of the first layer 86. Moreover, the thickness of the first layer 86 is less than the thickness of the second layer 88 and the thickness of the second layer 88 is less than the thickness of the third layer 90, in which the thickness of the first layer 86 is preferably between 45-55 Angstroms or more preferably 50 Angstroms, the thickness of the second layer 88 is between 110-130 Angstroms or most preferably 120 Angstroms, and the thickness of the third layer 90 is between 520-630 Angstroms or most preferably 570 Angstroms. It should be noted that even though the thickness of the second top electrode 84 is slightly less than the overall thickness of the first top electrode 82, according to other embodiment of the present invention, it would also be desirable to form second top electrode 84 with thickness less than, equal to, or greater than the overall thickness of the first top electrode 82, which is also within the scope of the present invention.

Viewing from an overall perspective, even though the first top electrode 82 is made from three layers of TiN, according to other embodiment of the present invention it would also be desirable to follow the same approach from the aforementioned embodiment to form a first top electrode 82 with more than three layers having gradient concentration such as four layers, five layers, or even six layers made of TiN on the surface of the MTJ stack 38 and then form a second top electrode 84 with non-gradient concentration on the surface of the first top electrode 82, which is also within the scope of the present invention.

Figure 2:
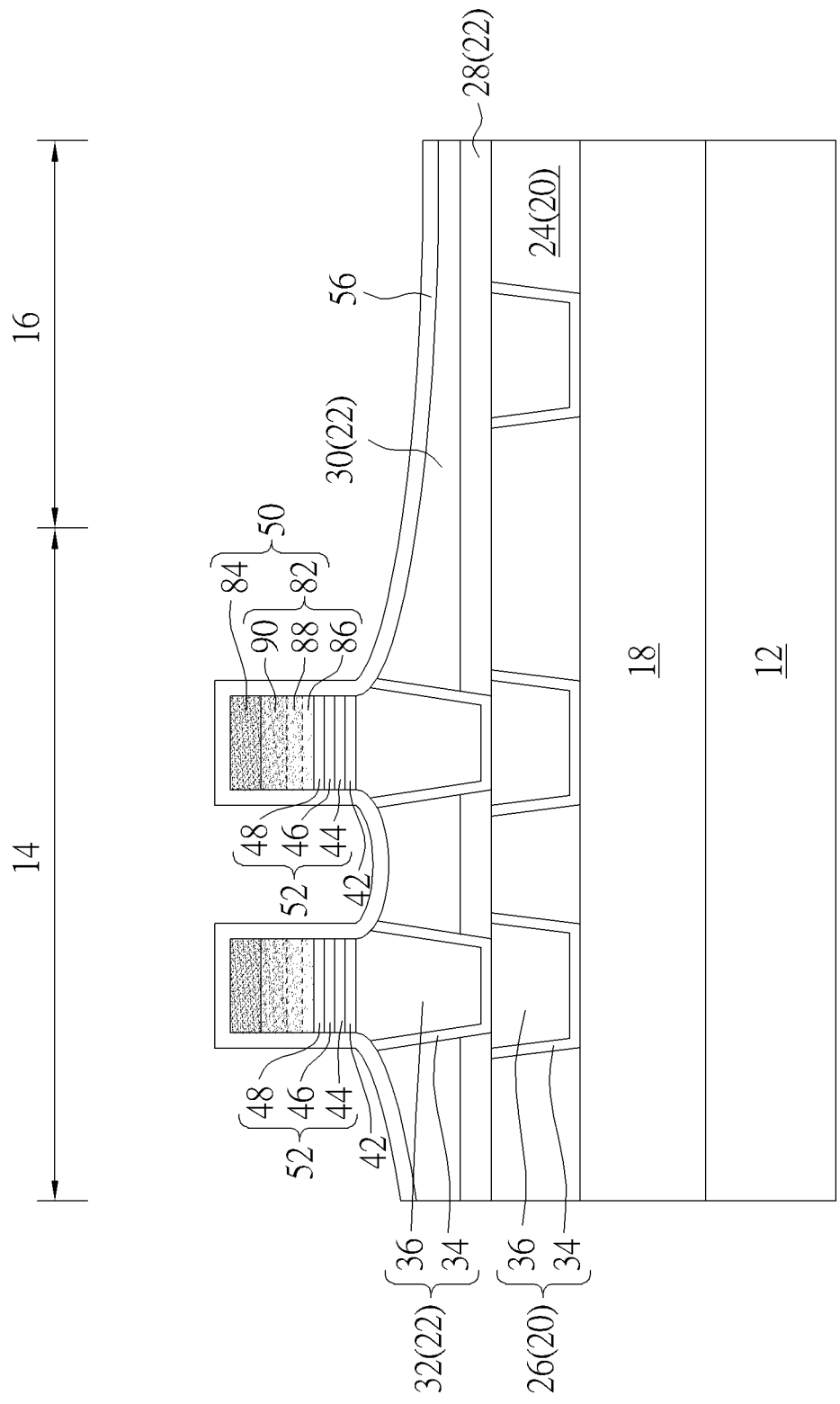

Next, as shown in FIG. 2, one or more etching process is conducted by using the patterned mask as mask to remove part of the top electrode 50, part of the MTJ stack 38, part of the bottom electrode 42, and part of the IMD layer 30 to form MTJs 52 on the MRAM region 14. It should be noted that a reactive ion etching (RIE) and/or an ion beam etching (IBE) process is conducted to remove the top electrode 50, MTJ stack 38, bottom electrode 42, and the IMD layer 38 in this embodiment for forming the MTJs 52. Due to the characteristics of the IBE process, the top surface of the remaining IMD layer 30 is slightly lower than the top surface of the metal interconnections 32 after the IBE process and the top surface of the IMD layer 30 also reveals a curve or an arc. It should also be noted that as the IBE process is conducted to remove part of the IMD layer 30, part of the metal interconnection 32 is removed at the same time to form inclined sidewalls on the surface of the metal interconnection 32 immediately adjacent to the MTJs 52. Next, a cap layer 56 is formed on the MTJs 52 while covering the surface of the IMD layer 30. In this embodiment, the cap layer 56 preferably includes silicon nitride, but could also include other dielectric material including but not limited to for example silicon oxide, silicon oxynitride (SiON), or silicon carbon nitride (SiCN).

Figure 3:
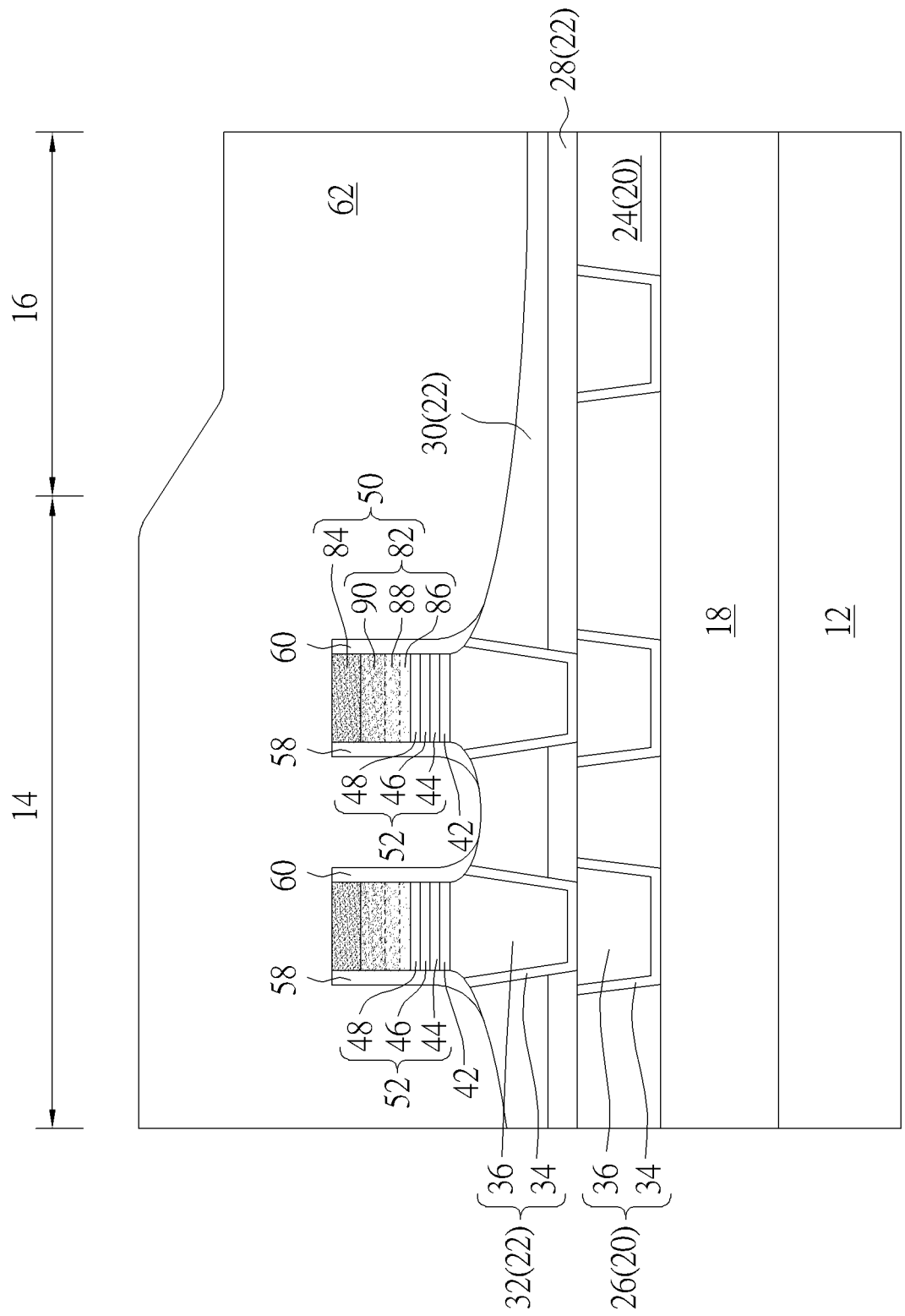

Next, as shown in FIG. 3, an etching back process is conducted to remove part of the cap layer 56 for forming spacers 58, 60 on sidewalls of each of the MTJs 52, and a flowable chemical vapor deposition (FCVD) process or an atomic layer deposition (ALD) process could be conducted to form an inter-metal dielectric (IMD) layer 62 on the MTJs 52 and the IMD layer 30 on the logic region 16. In this embodiment, the IMD layer 62 preferably include an ultra low-k (ULK) dielectric layer including but not limited to for example porous material or silicon oxycarbide (SiOC) or carbon doped silicon oxide (SiOCH). It should be noted by using the FCVD process or ALD process to form the IMD layer 62, the top surface of the IMD layer 62 on the logic region 16 would be slightly lower than the top surface of the IMD layer 62 on the MRAM region 14. Specifically, the height difference between the IMD layer 62 on the MRAM region 14 and the IMD layer 62 on the logic region 16 is less than 400 Angstroms.

Figure 4:
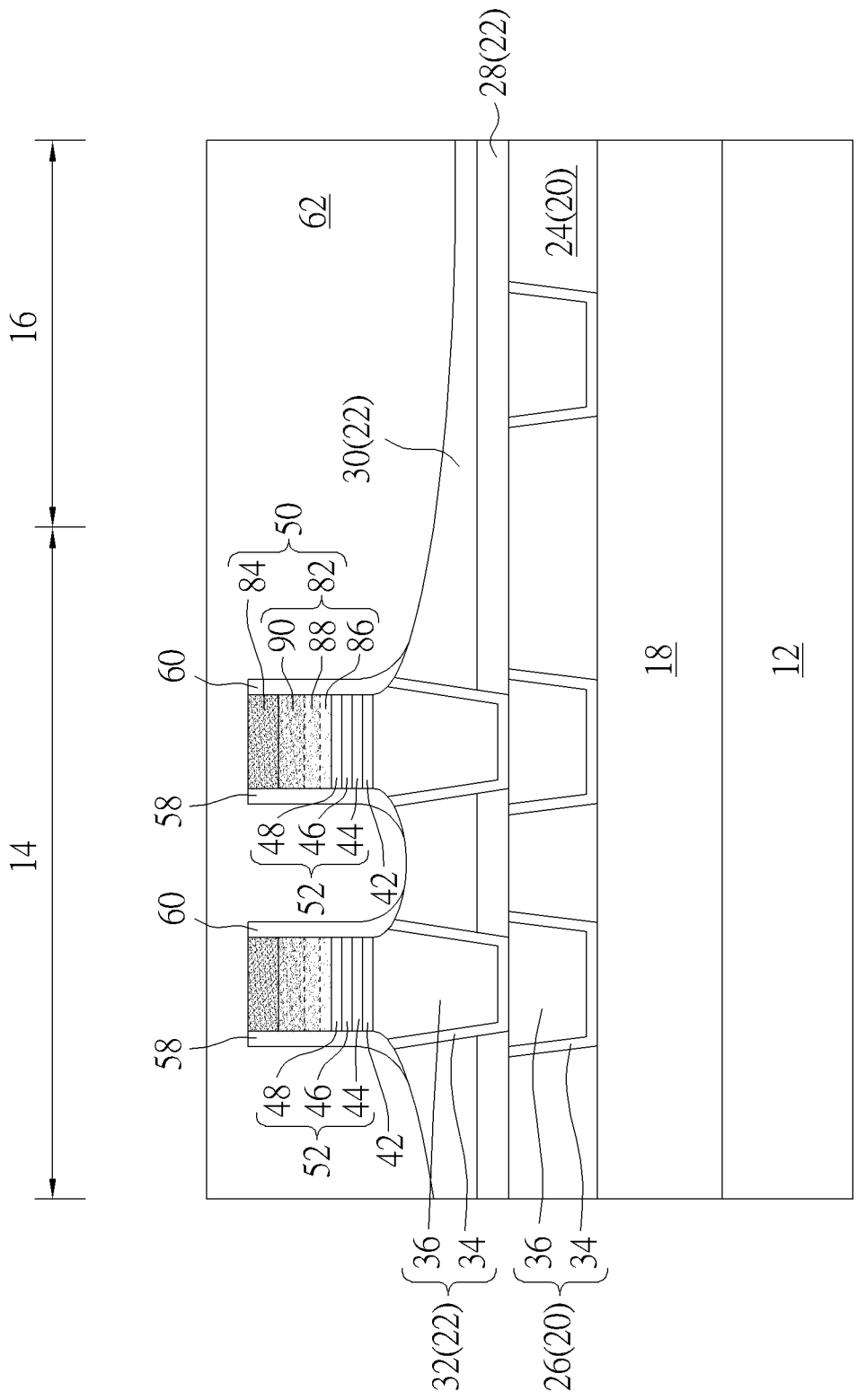

Next, as shown in FIG. 4, a planarizing process such as chemical mechanical polishing (CMP) is conducted to remove part of the IMD layer 62 on the MRAM region 14 and logic region 16 without exposing the top surfaces of the top electrodes 50 so that the top surface of the IMD layer 62 on the MRAM region 14 is even with the top surface of the IMD layer 62 on the logic region 16.

Figure 5:
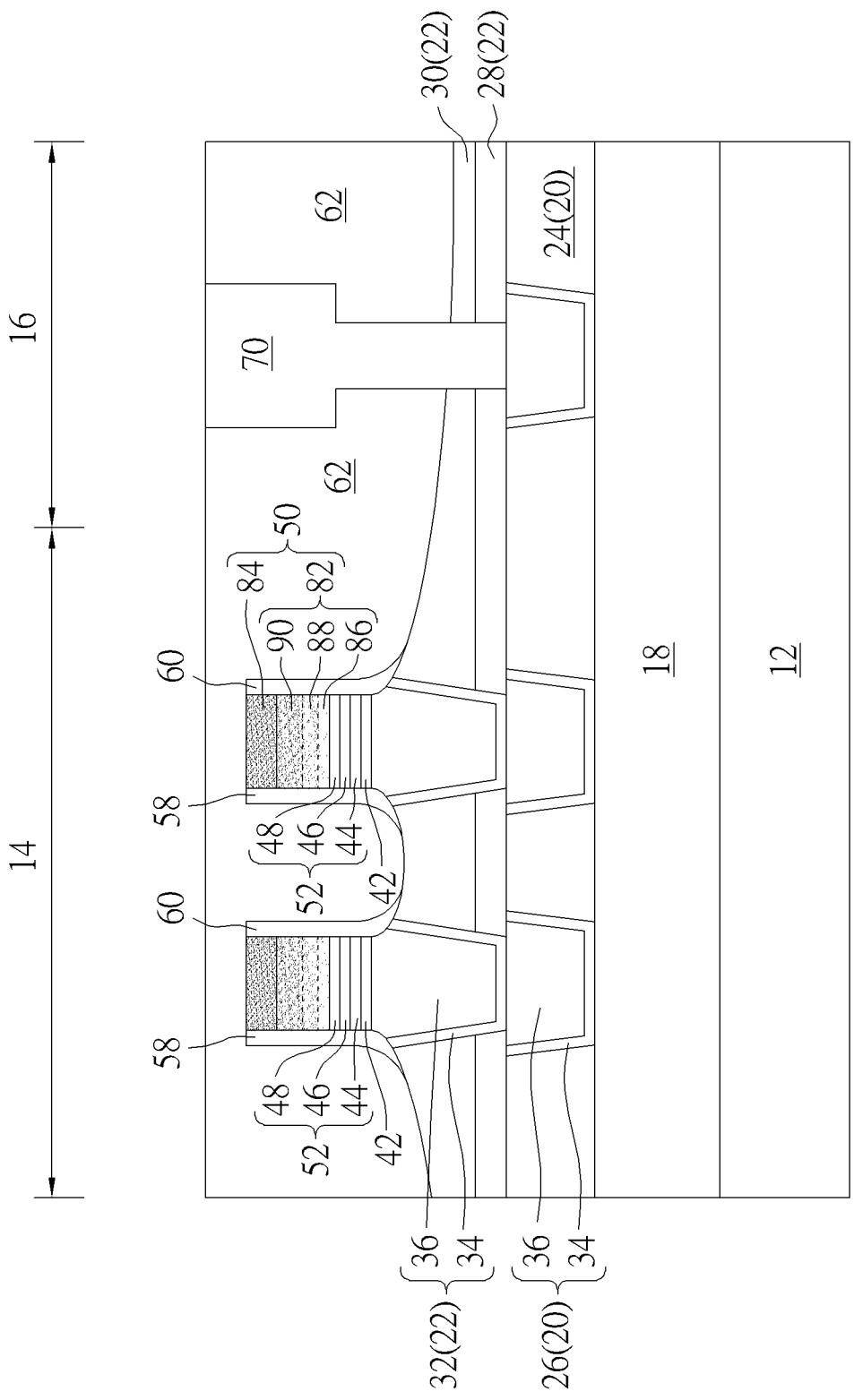

Next, as shown in FIG. 5, a pattern transfer process is conducted by using a patterned mask (not shown) to remove part of the IMD layer 62, part of the IMD layer 30, and part of the stop layer 28 on the logic region 16 to form a contact hole (not shown) exposing the metal interconnection 26 underneath and conductive materials are deposited into the contact hole afterwards. For instance, a barrier layer selected from the group consisting of titanium (Ti), titanium nitride (TiN), tantalum (Ta), and tantalum nitride (TaN) and a metal layer selected from the group consisting of tungsten (W), copper (Cu), aluminum (Al), titanium aluminide (TiAl), and cobalt tungsten phosphide (CoWP) could be deposited into the contact hole, and a planarizing process such as CMP could be conducted to remove part of the conductive materials including the aforementioned barrier layer and metal layer to form a metal interconnection 70 in the contact hole electrically connecting the metal interconnection 26.

Figure 6:
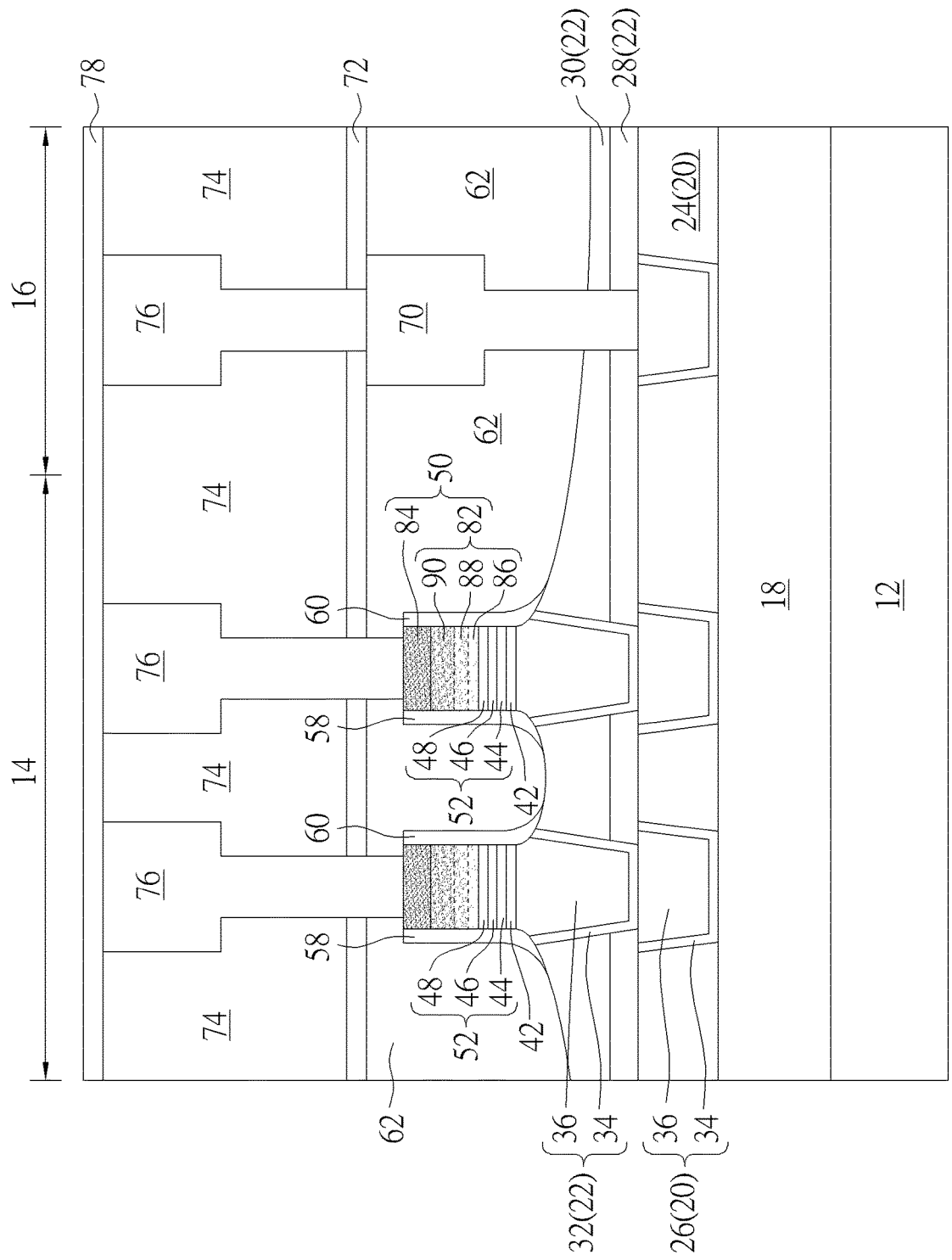

Next, as shown in FIG. 6, a stop layer 72 is formed on the MRAM region 14 and logic region 16 to cover the IMD layer 62 and metal interconnection 70, an IMD layer 74 is formed on the stop layer 72, and one or more photo-etching process is conducted to remove part of the IMD layer 74, part of the stop layer 72, and part of the IMD layer 62 on the MRAM region 14 and logic region 16 to form contact holes (not shown). Next, conductive materials are deposited into each of the contact holes and a planarizing process such as CMP is conducted to form metal interconnections 76 connecting the MTJs 52 and metal interconnection 70 underneath, in which the metal interconnections 76 on the MRAM region 14 directly contacts the top electrodes 50 underneath while the metal interconnection 76 on the logic region 16 directly contacts the metal interconnection 70 on the lower level. Next, another stop layer 78 is formed on the IMD layer 74 to cover the metal interconnections 76.

In this embodiment, the stop layers 72 and 78 could be made of same or different materials, in which the two layers 72, 78 could all include nitrogen doped carbide (NDC), silicon nitride, silicon carbon nitride (SiCN), or combination thereof. Similar to the metal interconnections formed previously, each of the metal interconnections 76 could be formed in the IMD layer 74 through a single damascene or dual damascene process. For instance, each of the metal interconnections 76 could further include a barrier layer and a metal layer, in which the barrier layer could be selected from the group consisting of titanium (Ti), titanium nitride (TiN), tantalum (Ta), and tantalum nitride (TaN) and the metal layer could be selected from the group consisting of tungsten (W), copper (Cu), aluminum (Al), titanium aluminide (TiAl), and cobalt tungsten phosphide (CoWP). Since single damascene process and dual damascene process are well known to those skilled in the art, the details of which are not explained herein for the sake of brevity. This completes the fabrication of a semiconductor device according to an embodiment of the present invention.

Overall, the present invention preferably forms a top electrode made of a first top electrode and a second top electrode on the MTJ, in which the first top electrode includes a gradient concentration while the second top electrode includes non-gradient concentration. Specifically, both the first top electrode and the second top electrode are made of TiN and the ratio of nitrogen to titanium increases from the bottom surface of the first top electrode toward the top surface of the first top electrode while the ratio of nitrogen to titanium in the second top electrode remains uniform without any increase or decrease. According to a preferred embodiment of the present invention, the combination of the bottom portion (or the first top electrode) of the top electrode having gradient concentration and the top portion (or the second top electrode) of the top electrode with non-gradient concentration could be used to improve tunnel magnetoresistance (TMR) and performance of the MRAM device.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A magnetic random access memory (MRAM) device, comprising:
   a magnetic tunneling junction (MTJ) on a substrate;
       a first top electrode on the MTJ, wherein the first top electrode comprises a gradient concentration; and
       a second top electrode on and directly contacting the first top electrode, wherein the second top electrode comprises a non-gradient concentration.

2. The MRAM device of claim 1, wherein a ratio of nitrogen to titanium increases from a bottom surface of the first top electrode toward a top surface of the first top electrode.

3. The MRAM device of claim 1, wherein the first top electrode comprises:
   a first layer on the MTJ;
   a second layer on the first layer; and
   a third layer on the second layer.

4. The MRAM device of claim 3, wherein a ratio of nitrogen to titanium of the second layer is greater than a ratio of nitrogen to titanium of the first layer.

5. The MRAM device of claim 3, wherein a ratio of nitrogen to titanium of the third layer is greater than a ratio of nitrogen to titanium of the second layer.

6. The MRAM device of claim 3, wherein a ratio of nitrogen to titanium of the second top electrode is greater than a ratio of nitrogen to titanium of the third layer.

7. The MRAM device of claim 3, wherein a ratio of nitrogen to titanium of the second top electrode is greater than a ratio of nitrogen to titanium of the second layer.

8. The MRAM device of claim 3, wherein a ratio of nitrogen to titanium of the second top electrode is greater than a ratio of nitrogen to titanium of the first layer.

9. The MRAM device of claim 3, wherein a thickness of the first layer is less than a thickness of the second layer.

10. The MRAM device of claim 3, wherein a thickness of the second layer is less than a thickness of the third layer.

\* \* \* \* \*